United States Patent
Kwon (10) Patent No.: US 7,781,965 B2
(45) Date of Patent: Aug. 24, 2010

(54) GLASS ENCAPSULATION CAP, ORGANIC ELECTROLUMINESCENT DEVICE HAVING THE SAME, MOTHER GLASS SUBSTRATE FOR PRODUCING MULTIPLE GLASS ENCAPSULATION CAPS, AND MANUFACTURING METHOD THEREOF

(75) Inventor: Seung Ho Kwon, Gumi (KR)

(73) Assignee: LG Display Co., Ltd., Seoul (KR)

( * ) Notice: Subject to any disclaimer, the term of this patent is extended or adjusted under 35 U.S.C. 154(b) by 468 days.

(21) Appl. No.: 11/515,801

(22) Filed: Sep. 6, 2006

(65) Prior Publication Data
US 2007/0120480 A1    May 31, 2007

(30) Foreign Application Priority Data
Nov. 28, 2005 (KR) ............... 10-2005-0114338
Nov. 30, 2005 (KR) ............... 10-2005-0115456

(51) Int. Cl.
*H01L 51/52* (2006.01)
(52) U.S. Cl. ............... 313/512; 257/100
(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25
See application file for complete search history.

(56) References Cited

U.S. PATENT DOCUMENTS

| | | | |
|---|---|---|---|
| 6,933,537 B2* | 8/2005 | Yee et al. ............... | 257/99 |
| 7,033,655 B2* | 4/2006 | Beteille et al. ............... | 428/1.5 |
| 7,038,376 B2* | 5/2006 | Liedenbaum ............... | 313/512 |
| 2002/0074931 A1* | 6/2002 | Liedenbaum ............... | 313/493 |
| 2005/0104513 A1* | 5/2005 | Lee et al. ............... | 313/506 |
| 2005/0116636 A1* | 6/2005 | Kang ............... | 313/512 |

FOREIGN PATENT DOCUMENTS

| KR | 10-2003-0044659 | 6/2003 |
|---|---|---|
| KR | 10-2005-0052250 A | 6/2005 |

* cited by examiner

*Primary Examiner*—Peter J Macchiarolo
*Assistant Examiner*—Donald L Raleigh
(74) *Attorney, Agent, or Firm*—Morgan, Lewis & Bockius LLP (57) ABSTRACT

The present invention relates to an encapsulation cap, an organic electroluminescent device having the same, and a manufacture method thereof.

The encapsulation cap protects each of elements in a device formed on a substrate from outside, comprising a sealing surface adhering to the substrate, wherein at least one groove is formed at an edge of the sealing surface.

The encapsulation cap protecting each of elements in a device formed on a substrate from outside comprises a sealant surface adhering to the substrate and a holding part holding each of elements of the device, wherein a concave part is formed on the sealant surface along an edge that the sealing surface and the holding part meet.

The encapsulation cap, the organic electroluminescent device having the same, and the manufacturing method thereof according to the present invention can prevent overflowing of a sealant because of the structure capable of holding extra-sealant applied to the sealing surface.

9 Claims, 7 Drawing Sheets

FIG. 1

RELATED ART

FIG. 2

RELATED ART

GLASS ENCAPSULATION CAP, ORGANIC ELECTROLUMINESCENT DEVICE HAVING THE SAME, MOTHER GLASS SUBSTRATE FOR PRODUCING MULTIPLE GLASS ENCAPSULATION CAPS, AND MANUFACTURING METHOD THEREOF

CROSS-REFERENCE TO RELATED APPLICATIONS

This application claims priority from Korean Patent Application Nos. 10-2005-0115456 filed on Nov. 30, 2005, and 10-2005-0114338 filed on Nov. 28, 2005, the contents of which are incorporated herein by reference in their entirety.

BACKGROUND OF THE INVENTION

1. Field of the Invention

The present invention relates to an encapsulation cap, an organic electroluminescent device having the same, and a manufacturing method thereof. Particularly, the present invention relates to the encapsulation cap capable of preventing defects like sealant overflowing.

Also, the present invention relates to a mother glass substrate for manufacturing polyhedral encapsulation cap capable of forming a plurality of encapsulation caps having a structure capable of preventing defects like sealant overflowing on one substrate.

2. Description Of The Related Art

Organic electroluminescence is a phenomenon emitting a light having a predetermined wavelength by energy from exciton formed by recombination of an electron and a hole injected to an organic (low or high molecule) thin film through an anode and a cathode. And, an organic electroluminescent device is a display device using this light-emitting phenomenon.

The organic electroluminescent device generally uses an encapsulation cap made of metal or glass.

Figure 1:
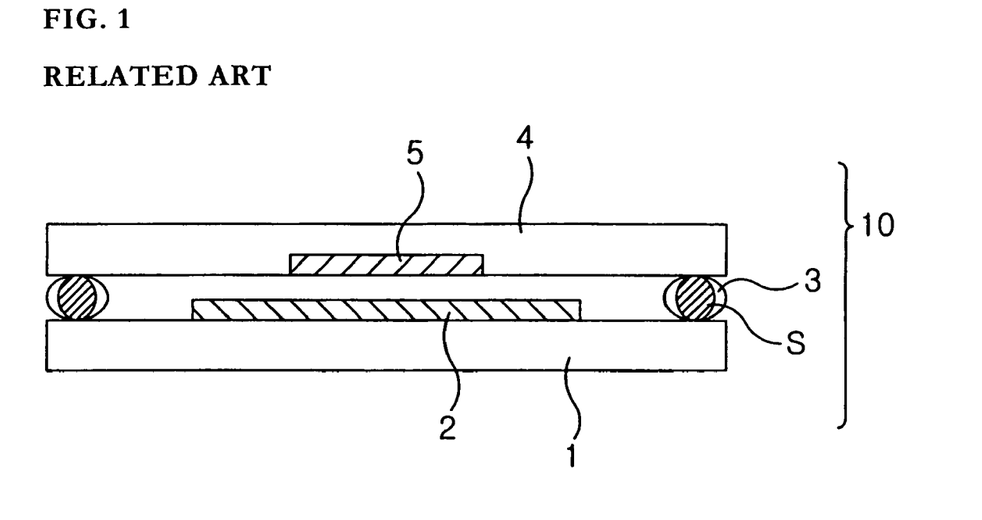
FIG. 1 is a sectional view showing an encapsulation structure of an organic electroluminescent device using an encapsulation cap in the art.

FIG. 1 is a sectional view showing the encapsulation structure of an organic electroluminescent device using the glass cap in the art.

In FIG. 1, an emitting part 2 of the organic electroluminescent device 10 is formed on a certain area of a substrate 1, and a glass cap 4 is bonded to the substrate 1 through a sealant 3 for separating the emitting part 2 from outer circumstance, that is, moisture or oxide.

Also, the inside of the glass cap 4 is concaved to be able to form a getter 5, that is, moisture absorbent.

Then, for the emitting part 2 not to directly contact with the glass cap 4 and the getter 5, a certain gap thicker than the emitting part 2 should be secured between the substrate 1 and the glass cap 4 oppositely disposed to each other. Therefore, a sealant 3 is generally manufactured by dispersing a spacer S in a liquid resin to maintain the gap between the substrate 1 and the glass cap 3.

But, when the spacer S is disposed between the substrate 1 and the glass cap 4, the thickness of a contacting part of the substrate 1 and the glass cap 4 is increased, thereby causing a problem that outside moisture or oxide may be permeated into inside of the organic electroluminescent device 10 through the sealant 3, and may erode the emitting part 2.

Also, in the process of distributing the sealant 3 onto the sealing surface of the encapsulation cap 4, if the amount of sealant 3 is not controlled precisely, especially in case of exceeding a proper amount of sealant 3, there may be a defect that the sealant 3 overflows inside or outside the sealing surface at the corner of the sealing surface bonded to the substrate 1 on which the encapsulation cap 4 and the emitting part 2 are formed.

Therefore, it has been necessary to develop an encapsulation cap having the structure capable of solving the defect like sealant overflowing occurred at the corner of the sealing surface.

Figure 2:
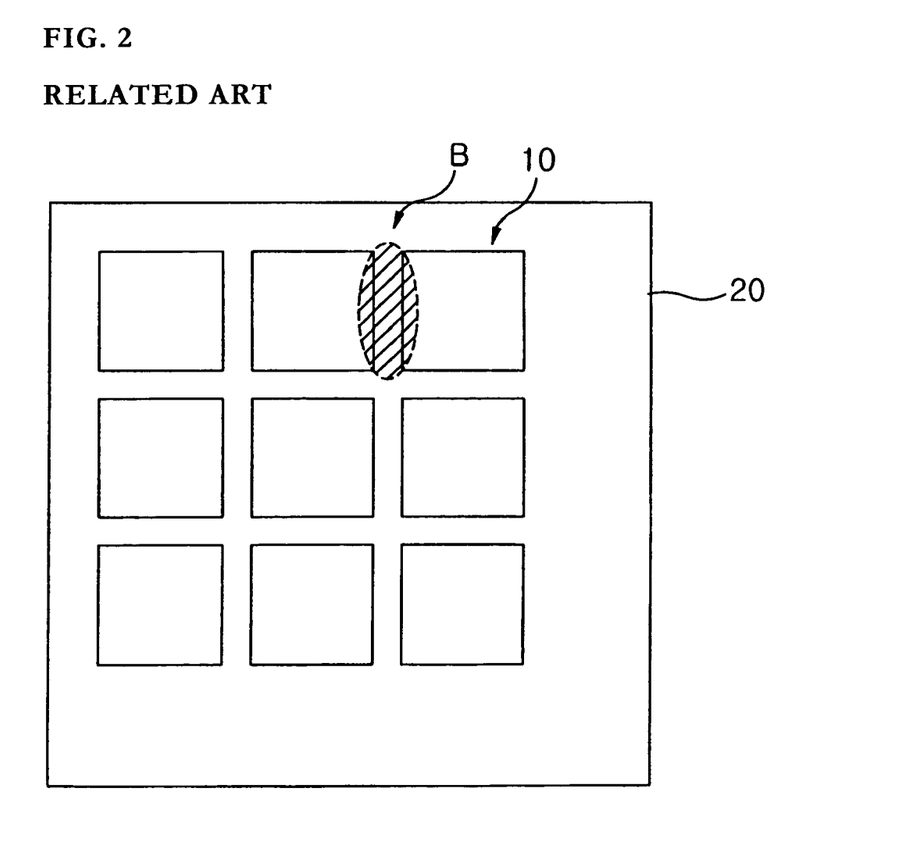
FIG. 2 is a plan view showing a mother glass forming an organic electroluminescent device in the art.

FIG. 2 is a plan view showing a mother glass forming an organic electroluminescent device in the art.

In FIG. 2, in the mother glass substrate 20 in which a plurality of organic electroluminescent devices 10 are formed, a gap (B area) between one organic electroluminescent device and another organic electroluminescent device 10 is very small. Thus, a large amount of sealant 3 exists between the organic electroluminescent devices 10 by the sealant 3 flowed to outside.

Thus, the process of scribing each organic electroluminescent device 10 from the mother glass substrate 20 does not go smoothly.

Therefore, there has been a need for an encapsulation cap having the constitution capable of cutting off the flow of sealant 3 to outer area.

SUMMARY OF THE INVENTION

One object of the present invention is to provide an encapsulation cap, and an organic electroluminescent device having the same, which can prevent defects like overflowing of a sealant occurred at the corner of a sealing surface.

Another object of the present invention is to provide an encapsulation cap, and an organic electroluminescent device having the same, which can encapsulate a sealant not having a spacer.

Another object of the present invention is to provide a mother glass substrate for manufacturing polyhedral encapsulation cap on one glass substrate.

Another object of the present invention is to provide an encapsulation cap, an organic electroluminescent device, and a manufacturing method thereof, having the structure in which a sealant does not affect function of the device by cutting off flowing of the sealant to outside.

Another object of the present invention is to provide an encapsulation cap, an organic electroluminescent device, and a manufacturing method thereof, which can cut off flowing of a sealant without forming a wall on a substrate.

The encapsulation cap according to one embodiment of the present invention comprises a sealing surface adhering to the substrate, wherein at least one groove is formed at an edge of the sealing surface.

The organic electroluminescent device according to another embodiment of the present invention comprises a substrate; a first electrode formed on the substrate in a first direction; a second electrode formed in a second direction different from the first direction; an emitting area including an organic layer formed on an area that the first electrode and the second electrode cross; and an encapsulation cap bonded to the substrate by a sealant to encapsulate the emitting area. At least one groove is formed at an edge of a sealing surface of the encapsulation cap onto which the sealant is applied.

The mother glass substrate for polyhedral encapsulation cap for manufacturing a plurality of encapsulation caps for encapsulating the organic electroluminescent device according to another embodiment of the present invention comprises a frame form of protrusion part defining a space for holding the emitting area of the organic electroluminescent device, wherein at least one first groove is formed on a top surface of the protrusion part, and a second groove is formed between adjacent protrusion parts.

The encapsulation cap protecting elements formed on a substrate according to another embodiment of the present invention from outside comprises a sealant surface adhering to the substrate and a holding part holding each of elements of the device, wherein a concave part is formed on the sealant surface along by an edge meeting the sealing surface and the holding part.

The organic electroluminescent device according to another embodiment of the present invention comprises a substrate; a first electrode formed on the substrate in a first direction; a second electrode formed in a second direction different from the first direction; an emitting area including an organic layer formed on an area that the first electrode and the second electrode cross; and an encapsulation cap bonded to the substrate by a sealant to encapsulate the emitting area. The encapsulation cap comprises a sealant surface adhering to the substrate and a holding part holding each of elements of the device, wherein a concave part is formed on the sealant surface along by an edge meeting the sealing surface and the holding part.

The manufacturing method of the encapsulation cap according to another embodiment of the present invention comprises forming a sealant-applied area by etching a glass substrate; and forming a device-encapsulating area by etching the glass substrate on which the sealant-applied area is formed.

The encapsulation cap, organic electroluminescent device having the same, and manufacturing method thereof, according to the present invention can cut off permeation of moisture and oxide into the device because the sealing part is thin by bonding the substrate and the encapsulation cap with a sealant not including a spacer.

The encapsulation cap, the organic electroluminescent device having the same, and manufacturing method thereof, according to the present invention can prevent overflowing of the sealant due to the structure capable of holding an extra amount of sealant applied to the sealing surface.

The mother glass substrate for manufacturing polyhedral encapsulation cap according to the present invention can easily separate each of device after contacting the substrate formed a plurality of the emitting part as well as manufacture a plurality of the encapsulation cap from the one substrate.

DETAILED DESCRIPTION OF THE INVENTION

The present invention will be more clearly understood from the detailed description in conjunction with the following drawings.

Figure 3A:
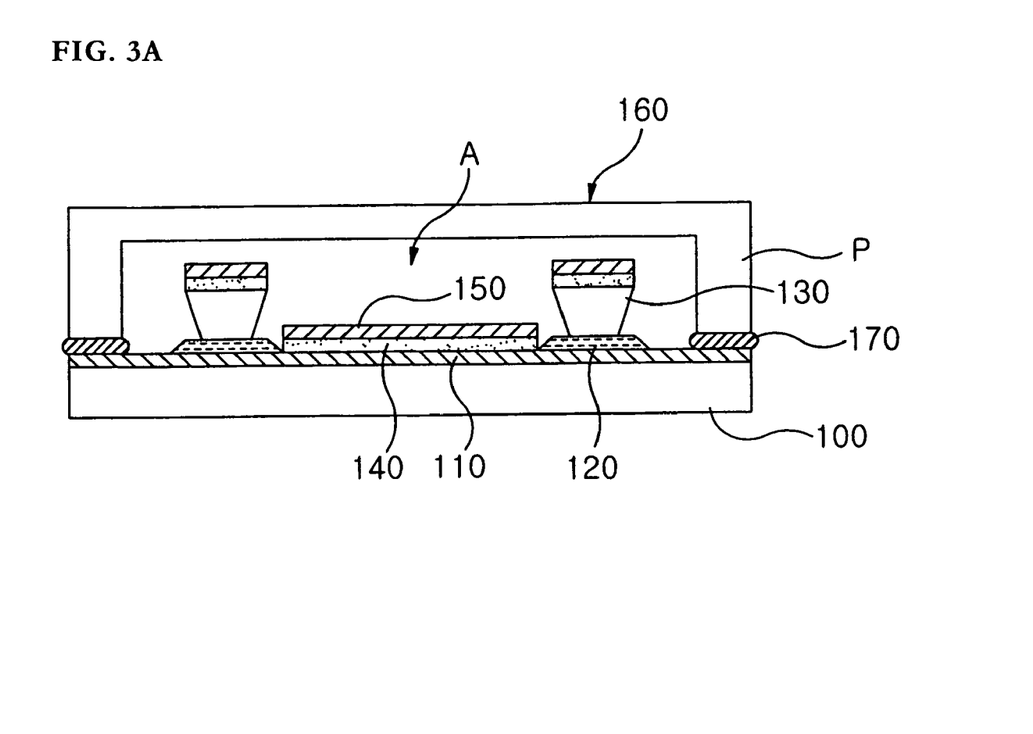
FIG. 3A is a sectional view showing the organic electroluminescent device according to one embodiment of the present invention.

FIG. 3A is a sectional view showing the organic electroluminescent device according to one embodiment of the present invention. Only, the organic electroluminescent device of the embodiment is of a passive type.

In FIG. 3A, the organic electroluminescent device according to a first embodiment of the present invention includes a glass substrate 100, and indium tin oxide or anode electrode layer 110 of metal formed by sputtering is formed on the substrate 100.

An insulation layer 120 formed by applying an insulation material, for example polyimide, is disposed on the top of the anode electrode layer 110.

A wall 130 crossing over the anode electrode layer 110 is formed on the top of the insulation layer 120. The wall plays a role to separate a cathode electrode layer 150 as described below.

On the top of the anode electrode layer 110 and the wall 130, an organic layer 140, for example, consisting of electron injecting layer, electron transmitting layer, emitting layer, hole transmitting layer, and hole injecting layer, is formed.

The cathode electrode layer 150 crossing over the anode electrode layer 110 is formed on the top of the organic layer 140.

The cathode electrode layer 150 is preferably formed of a material having low work function, for example, high reactivity alloy based on alkali metals and alkaline earth metals. But, these reactivity metals cause a problem to worsen the device characteristic or reduce life of the device because they are easily oxidized by reacting with oxide or moisture.

Also, the organic layer 140 formed at the bottom of the cathode electrode layer 150 is easily burned by oxide and moisture.

Therefore, the organic electroluminescent device according to the present invention forms a protective layer by using the encapsulation cap 160 made of glass material, and the encapsulation cap 160 is bonded by the sealant 170 disposed in between the anode electrode layer 110. The organic electroluminescent device according to the present invention need not disperse a spacer into the sealant 170 because of the structural characteristic of the encapsulation cap 160 as described below. Thus, it should be noted that the sealant 170 can be applied thinly.

The encapsulation cap 160 according to an embodiment of the present invention may comprise a laminating body including the anode electrode layer 110, the organic layer 140, and the cathode electrode layer 150, formed on the substrate 100 between inside of the encapsulation cap 160 and the substrate 100, that is, a protruded form of protrusion part P from inside the encapsulation cap 160 so as to secure a space for holding the emitting part of the organic electroluminescent device.

In one embodiment of the present invention, the protrusion part P of the encapsulation cap 160 can perform same function as the spacer because it is formed to a height capable of forming a certain gap enough for the emitting part to be disposed between the substrate 100 and inside of the encapsulation cap 160. Thus, the organic electroluminescent device according to the present invention is advantageous in that it need not use a spacer in the sealant 170.

The encapsulation cap 160 according to one embodiment of the present invention can be formed by selectively removing soda-lime or non-alkali of glass substrate with using wet etching or sand blast method. That is, the protrusion part P can be formed by removing the other area of the glass substrate except for an area in which the protrusion part P is formed by a certain thickness. The removed depth of the glass substrate is the same as the height of the protrusion part P. Here, it is desirable that the height from inside of the encapsulation cap to the top of the protrusion part P is between 10 μm and 300 μm.

It is preferable to form the encapsulation cap 160 by partially removing the glass substrate by wet etching method. When the glass substrate is etched by wet etching method, the edge of the top surface of the protrusion part P of the encapsulation cap 160 is smoothly rounded.

Also, in the edge of the top part of the protrusion part P of the encapsulation cap 160 according to one embodiment of the present invention, a groove capable of holding extra-sealant at the time of bonding to the substrate 100 is formed. Hereinafter, this will be described with reference to the drawings.

Figure 3B:
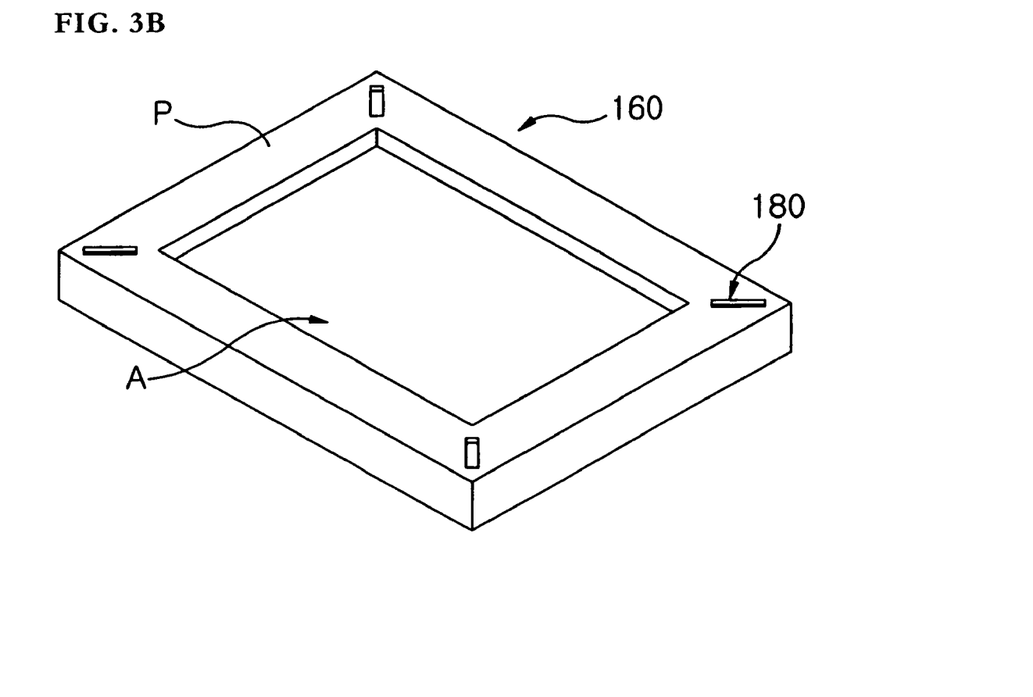
FIG. 3B is a perspective view showing the structure of the encapsulation cap of FIG. 3A.
Figure 3C:
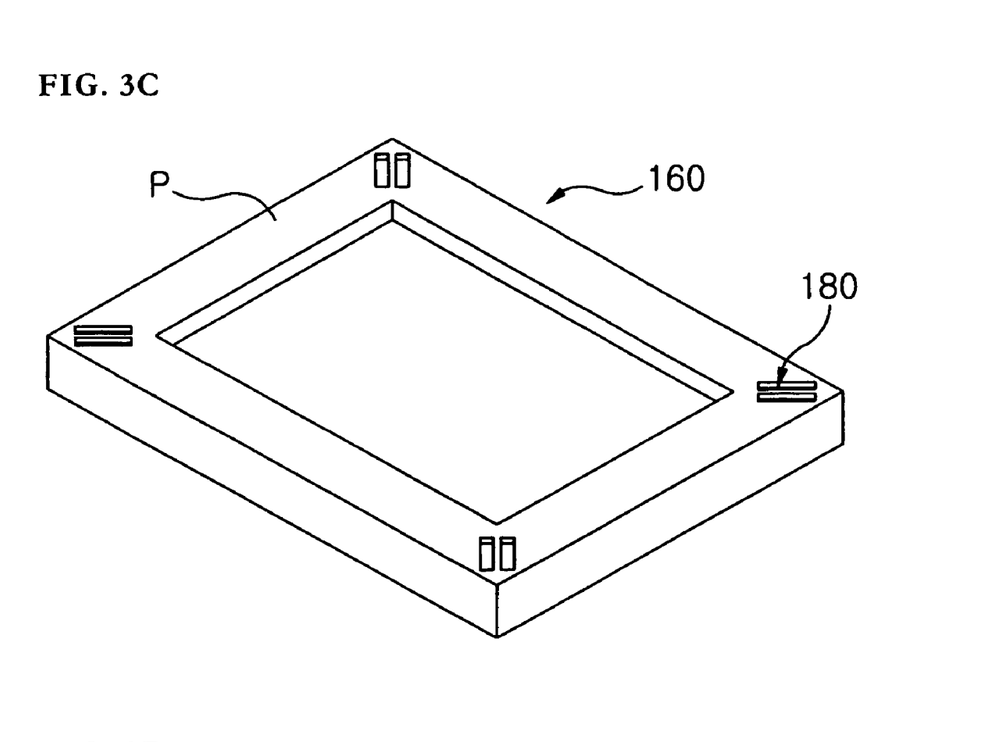
FIG. 3C and FIG. 3D are views showing another embodiment of the encapsulation cap of FIG. 3A.
Figure 3D:
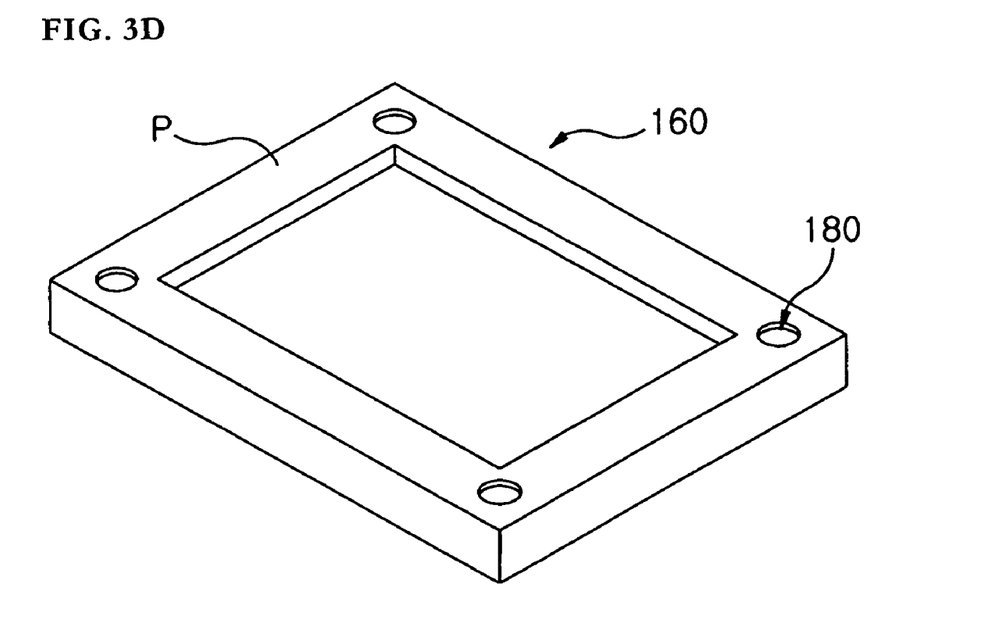

FIG. 3B is a perspective view showing the structure of the encapsulation cap of FIG. 3A. And, FIG. 3C and FIG. 3D are views showing another embodiment of the encapsulation cap of FIG. 3A.

In FIG. 3B, an oblique line of groove 180 is formed in each edge of top surface of the protrusion part P defining a space A capable of holding the emitting part.

The groove 180 secures enough space for holding extra-sealant when more sealant 170 than the margin of error is dispensed on the sealing surface of the encapsulation cap 160, that is, the top surface of the protrusion part P in the present embodiment.

Thus, in case of compressing the encapsulation cap 160 and the substrate on which the organic electroluminescent part is formed, when the sealant 170 is applied, there is no such problem that extra-sealant is flown in or out of the sealing surface.

The width and depth of the groove 180 are determined according to a number of process conditions, such as size of the organic electroluminescent device manufactured, width and depth of the protrusion part P of the encapsulation cap 160, applied force at the time of compressing the substrate 100 and the encapsulation cap 160 after applying the sealant 170, etc. These process conditions may be decided by a person skilled in the art without much difficulty.

More detail, for preventing the sealant 170 is flown out of the sealing surface when the substrate 100 and the encapsulation cap 160 compress, it is preferable that the extra-sealant is hold into the groove 180 well. Preferably, for holding the sealant 170 into the groove 180 well at the time of compressing the substrate 100 and the encapsulation cap 160, the groove 180 is formed to have 100 μm or more of depth.

Also, it is preferable that the groove 180 has same depth as the space A for holding the emitting part. In case the depths of the groove 180 and the space A are same, the protrusion part P and the groove 180 can be formed by one time etching process in the formation process of the encapsulation cap 160, as explained below.

Also, the form of the groove 180 is not limited as long as it is structured enough to hold extra-sealant. That is, it is fine to form the oblique line of groove 180 as pairs in each edge of the protrusion part P as shown in FIG. 3C, or to form a round groove 180 in each edge of the protrusion part P as shown in FIG. 3D.

The desirable form of the groove 180 is of oblique line. In case of compressing the encapsulation cap 160 and the substrate after the sealant 170 is applied thereto, the sealant 170 is flown out of the sealing surface mostly at the edge area. In this case, it is an oblique line of the groove 180 that can best hold the sealant 170 flowing to outside from the sealing surface, without obstructing the flow of the sealant 170.

It is desirable to use wet etching method as the method of forming the groove 180 at the edge of the protrusion part P of the encapsulation cap 160. Also, the encapsulation cap 160 having a frame form of protrusion part P including the groove 180 at the edge can be manufactured through single etching process by simultaneously etching a part of the glass substrate on which the groove 180 is formed, At the time of forming the protrusion part P by partially removing a part of the glass substrate by using wet etching method.

This will be described in detail.

First, the other part except an area on which the frame form of protrusion part P is formed (except the area on which the groove 180 is formed) is exposed by masking-treating the glass substrate prepared separately as resist. In the case, a part on which the groove 180 is formed is also exposed.

Next, the exposed part of the substrate is removed by a predetermined depth by soaking the masking-treated glass substrate in etching liquid for a certain period of time.

Finally, the etched glass substrate is washed well with a washing liquid like pure water, and then the resist remaining on the surface of the substrate is removed, to obtain a completed encapsulation cap 160.

Hereinafter, a preferable embodiment for the structure of the mother glass substrate for manufacturing a polyhedral encapsulation cap 160 capable of forming a plurality of encapsulation caps 160 from one substrate, and the manufacturing method thereof according to one embodiment of the present invention will be described.

Figure 4A:
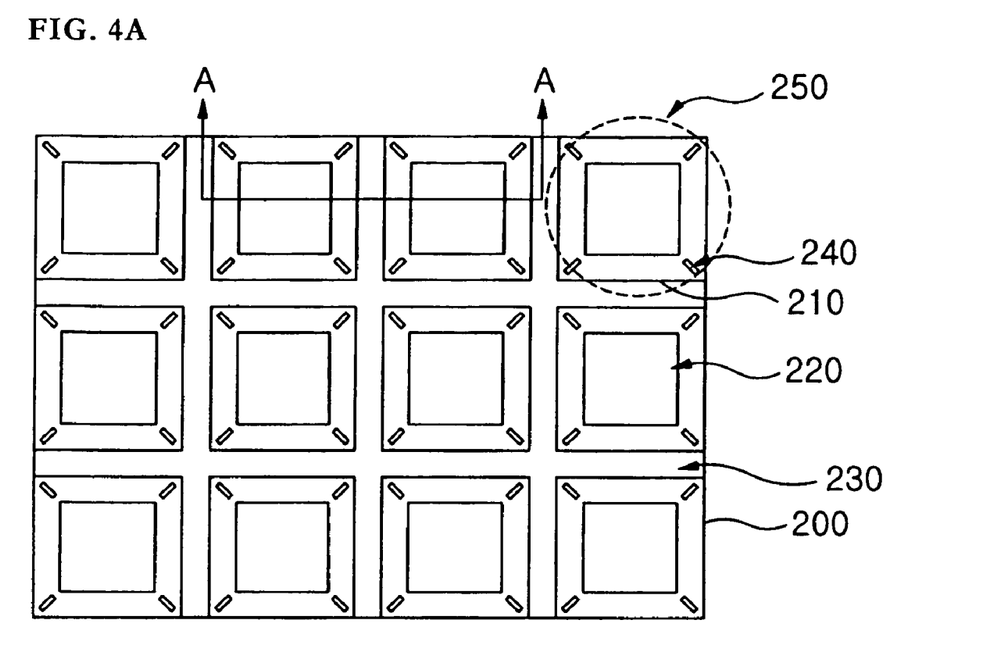
FIG. 4A is a plan view of the mother glass substrate for manufacturing polyhedral encapsulation cap according to one embodiment of the present invention.

FIG. 4A is a plan view of the mother glass substrate for manufacturing polyhedral encapsulation cap according to one embodiment of the present invention. And, FIG. 4B is a partial plan view of the mother glass substrate for manufacturing the encapsulation cap of FIG. 4A cut by line A-A.

Figure 4B:
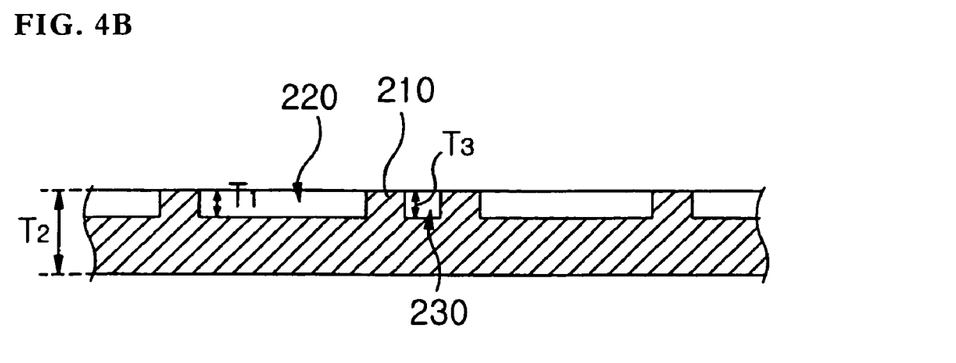
FIG. 4B is a partial plan view cutting the mother glass substrate for manufacturing the encapsulation cap of FIG. 4A along line A-A.

In FIG. 4A and FIG. 4B, the mother glass substrate for manufacturing polyhedral encapsulation cap according to one embodiment of the present invention includes a plurality of frame form of protrusion parts 210 disposed on a glass substrate 200 in the form of lattice, and a plurality of concave parts 220 defined by the protrusion parts 210. One protrusion part 210 and one concave part 220 define the encapsulation cap 250 for encapsulating the organic electroluminescent device. The present embodiment exemplifies a case of forming 3×4 of encapsulation cap 250 on one glass substrate 200.

The top surface of the protrusion part 210 corresponds to the sealing surface on which the sealant is applied for bonding to the substrate (not shown) on which the organic electroluminescent part is formed.

The protrusion part 210 can perform the same function as the spacer because the concave part 220 is modified to a height capable of forming a space enough for holding the organic electroluminescent part formed on a separate substrate. Therefore, all the encapsulation caps 250 separated from the mother glass substrate according to the present invention is suitable for bonding to the substrate on which the organic electroluminescent part is formed, only with the sealant not including the spacer.

Also, an oblique line of groove 240 is formed at an edge of the protrusion part 210. In the encapsulating process of the organic electroluminescent device, the groove 240 functions to secure enough space for holding extra-sealant when a sealant more than the margin of error is dispensed on the top surface of the protrusion part 210.

The form and function of the groove 240 are same as the encapsulation cap 160 according to one embodiment of the present invention shown in FIG. 3B, FIG. 3C and FIG. 3D, and so will not be explained further.

The protrusion part 210 is formed to a height capable of forming the concave part 220 suitable for holding the organic electroluminescent device. The height T1 from the bottom surface of the concave part 220 to the top surface of the protrusion part 210 is, for example, 10 μm to 300 μm Also, the total thickness T2 of the substrate 200 including the protrusion part 210 is, for example, 0.63 mm to 0.7 mm.

Also, another groove 230 is disposed between the protrusion parts 210, 210 of adjacent encapsulation caps 250, 250. The groove 230 is useful in the subsequent process of separating a plurality of encapsulation caps 250 formed on the glass substrate 200 separately from each other. That is, if scribing and force are applied along the groove 230 formed between the adjacent encapsulation caps 250, 250, the encapsulation caps 250 are separated to individual ones easily because stress is concentrated on the part on which the groove 230 is formed.

The above is also applicable when separating the encapsulation caps 250 by individual devices (cells) after arranging the substrate on which a plurality of emitting parts of the organic electroluminescent device are formed, and the mother glass substrate of the present invention, and bonding them by applying a sealant.

It is desirable that the depth T3 from the top surface of the protrusion part 210 to the bottom of the groove 230 is the same as the height T1 of the protrusion part 210, but it is not necessary.

The mother glass for manufacturing polyhedral encapsulation cap according to one embodiment of the present invention can be manufactured by using wet etching method, sand blast method, or press method. Preferably, the mother glass for manufacturing polyhedral encapsulation cap according to one embodiment of the present invention is manufactured by wet etching method or sand blast method. More preferably, it is manufactured by wet etching method.

The manufacturing method of the mother glass for manufacturing polyhedral encapsulation cap according to one embodiment of the present invention by the wet etching method is as follows.

First, the glass substrate 200 having a size capable of forming 3×4 of encapsulation cap 250 is prepared. In this case, soda-lime or non-alkali of glass substrate can be used as the glass substrate 200.

Next, a resist is formed on the front surface of the substrate 200, and by patterning the formed resist, the other part of the glass substrate except an area on which the protrusion part P is formed (except the area on which the groove 240 is formed) is exposed. At this time, the part on which the groove 240 is formed is also exposed. This is called as masking-treatment of the glass substrate 200.

Then, the exposed part of the glass substrate 200 is removed by a predetermined depth by soaking the masking-treated glass substrate 200 in etching liquid for a certain period of time. Here, the soaking time of the glass substrate 200 in etching liquid may be varied depending on some factors, for example, quality of the glass substrate 200, type of etching liquid, and quantity removed from the glass substrate 200. But, a person skilled in the art can properly select them.

Finally, the resist remaining on the top of the protrusion part 210 is removed after the etched glass substrate 200 is washed well with washing liquid like pure water.

In case of using the wet etching method as shown above, the glass substrate 200 can be removed by uniform depth from desired parts, that is, an area on which the concave part 220 and the groove 230 are formed. Also, the edge of the top surface of the protrusion part 210 can be smoothly rounded.

Hereinafter, the encapsulation cap of an active type of organic electroluminescent device according to another embodiment of the present invention will be described in detail.

Figure 5:
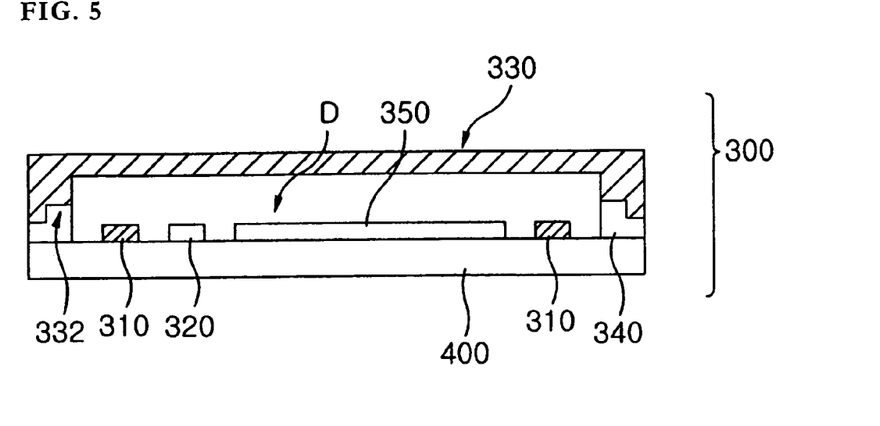
FIG. 5 is a sectional view schematically showing the organic electroluninescent device according to another embodiment of the present invention.

FIG. 5 is a sectional view schematically showing the organic electroluminescent device according to another embodiment of the present invention. And, FIG. 6 is a sectional view showing the organic electroluminescent pixel of FIG. 5.

In FIG. 5, the organic electroluminescent device 300 according to the present invention includes an active area 350 formed on a substrate 400, a circuit part 320, a circuit wiring part 310, an encapsulation cap 330, and a sealant 340.

The active area 350 consists of a plurality of organic electroluminescent pixels, and is an emitting area.

Figure 6:
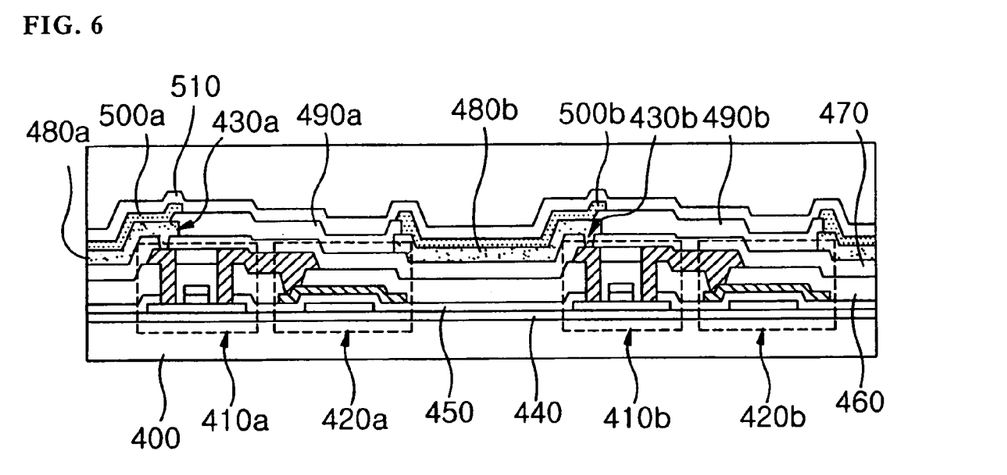
FIG. 6 is a sectional view showing the organic electroluminescent pixel of FIG. 5.

In detail, in FIG. 6, the pixel is an active matrix-type of device, and includes driving transistors 410A and 410B, capacitors 420A and 420B, connecting contacted holes 430A and 430B, anode electrode layers 480A and 480B, insulation layers 490A and 490B, organic layers 500A and 500B, and cathode electrode layer 510.

The driving transistors 410A and 410B are driving devices driving the pixel, particularly a diode, and each are connected to the anode electrode layers 480A and 480B through the connecting contacted holes 430A and 430B. For example, a first driving transistor 410A is connected to a first anode electrode layer 480A through a first connecting contacted hole 430A, and a second driving transistor 410B is connected to a second anode electrode layer 480B through a second connecting contacted hole 430B.

Also, the driving transistors 410A and 410B each are connected to the capacitors 420A and 420B. That is, the first driving transistor 410A is connected to a first capacitor 420A, and the second driving transistor 410B is connected to a second capacitor 420B.

Each of the capacitors 420A and 420B consist of a capacitor electrode, a voltage opening electrode, and a first insulation layer disposed between the capacitor electrode and the voltage opening electrode.

The connecting contact holes 430A and 430B are connected to each drain of the driving transistors 410A and 410B, consist of metal, and provide a positive voltage applied through the driving transistors 410A and 410B to the anode electrode layers 480A and 480B.

The anode electrode layers 480A and 480B provide holes to the organic layers 500A and 500B according to the provided positive voltage. The insulation layers 490A and 490B are formed between the anode electrode layers 480A and 480B to block electrical connection between the anode electrode layers 480A and 480B. Only, the insulation layers 490A and 490B partially cover the top surface of the anode electrode layers 480A and 480B.

The organic layers 500A and 500B are formed on the anode electrode layers 480A and 480B, and include Hole Injection Layer HILL, Hole Transporting Layer HTL, Emitting Layer EL, Electron Transporting Layer ETL and Electron Injection Layer EIL. When a positive voltage is applied to the anode electrode layers 480A and 480B, and a negative voltage is applied to the cathode electrode layer 510, the organic layers 500A and 500B generate a light having a certain wavelength.

The cathode electrode layers 510 are formed on the organic layers 500A and 500B.

The circuit part 320 inputs a signal into the transistor of the pixel, and is connected to the circuit wiring part 310.

The circuit wiring part 310 plays a role to supply driving power to the pixels.

The encapsulation cap 330 encapsulates all areas, that is, the active area 350, the circuit part 320, and the circuit wiring part 310, except the pad part (not shown).

The encapsulation cap 330 includes a sealing surface adhering to the substrate 400, and a holding part D holding each of elements of the device. On the sealant surface, a concave part 332 is formed along an edge that the sealing surface and the holding part D meet.

The concave part 332 functions to secure enough space for holding extra-sealant when a sealant 340 more than the margin of error is dispensed on the sealing surface of the encapsulation cap 330.

When the encapsulation cap 330 and the substrate 400 having the active area D formed thereon compress each other after the sealant 340 is dispersed thereto, extra-sealant 340 is formed inside the sealing surface, that is, the concave part 332, than outside the sealing surface. Thus, the flowing of the sealant 340 to outside of the sealing surface may be prevented.

The width and depth of the concave part 332 are determined according to a number of process conditions, such as size of the organic electroluminescent device manufactured, applied force at the time of compressing the substrate 400 and the encapsulation cap 330 after applying the sealant 340, etc. These process conditions may be decided by a person skilled in the art without much difficulty.

The width of the concave part 332 is 30% or less of the total width of the sealing surface.

If the width of the concave part 332 is more than 30%, the sealant 340 may be applied to the concave part 332 itself, and flowed into the holding part D, not that extra sealant flows into the concave part 332 at the time of compressing the encapsulation cap 330 and the substrate 400.

Also, the width of the concave part 332 is between 50 μm and 100 μm. If the width of the concave part 332 is more than 100 μm, the balance of the encapsulation cap 330 may be broken because the width of the sealing surface contacting with the substrate 400 in between the sealant 340 becomes relatively small. Preferably, the width of the concave part 332 is in the range of 50 μm and 55 μm.

Hereinafter, the manufacturing process of the encapsulation cap 330 will be described in detail.

FIG. 7A to FIG. 7H are sectional views showing the manufacturing process of the encapsulation cap of FIG. 5.

Figure 7A:
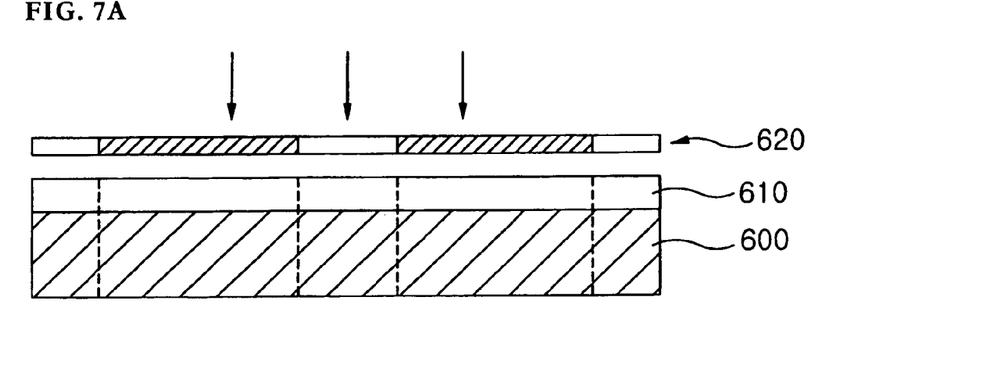
FIG. 7A to FIG. 7H are sectional views showing the manufacturing process of the encapsulation cap of FIG. 5.

First, as shown in FIG. 7A, a photoresist 610 is applied onto top of a glass substrate 600, and then a first mask 620 on which a pattern is formed is disposed on the top of the photoresist 610. The first mask 620 forms the pattern of a size corresponding to the sealant 340-applied area of the substrate 400.

Subsequently, a light is shot onto the top of the first mask 620. Accordingly, a part of the photoresist 610 exposed by the light is cured, and the other part not exposed by the light is not cured.

Figure 7B:
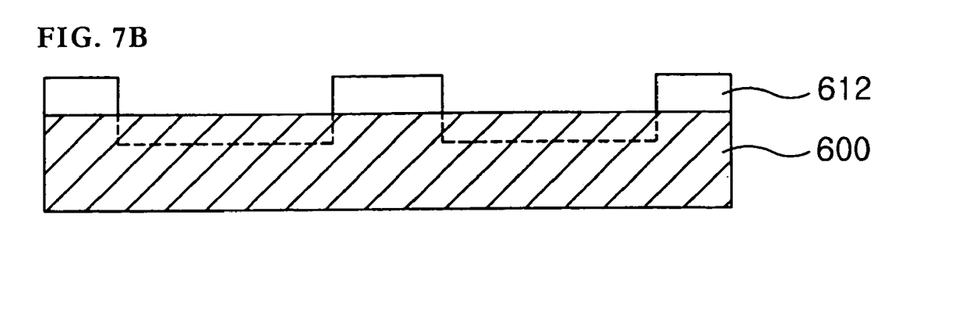

Then, the photoresist pattern 612 is formed as shown in FIG. 7B, by developing the exposed glass substrate 600 after removing the first mask 620.

Figure 7C:
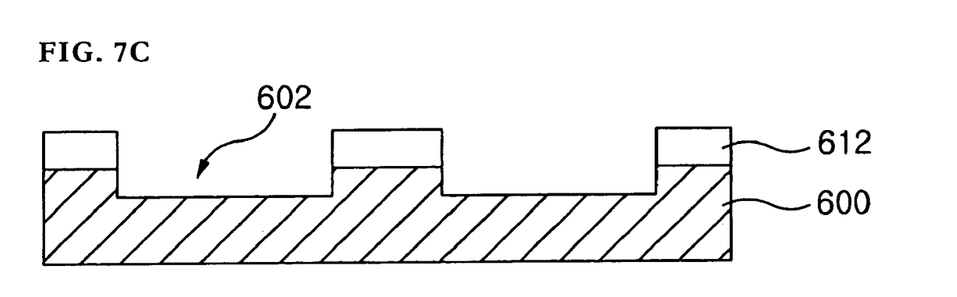
Figure 7D:
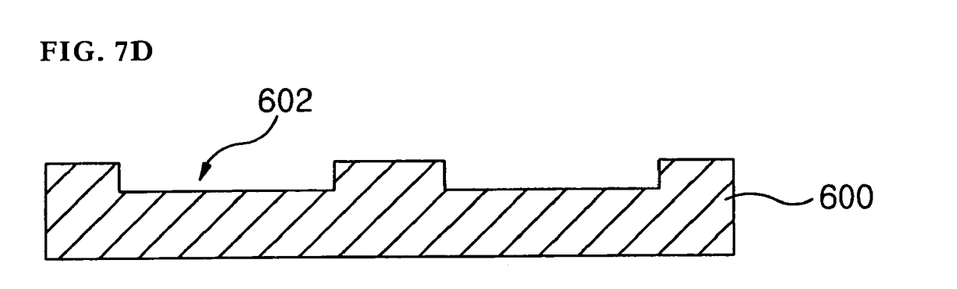

Next, a first concave part 602 having a certain depth is formed by soaking the glass substrate 600 on which the pattern 612 is formed, in an etching solution for a certain period of time, as shown in FIG. 7C. And, the photoresist pattern 612 is peeled off by developing the glass substrate 600 on which the first concave part 602 is formed, as shown in FIG. 7D.

Figure 7E:
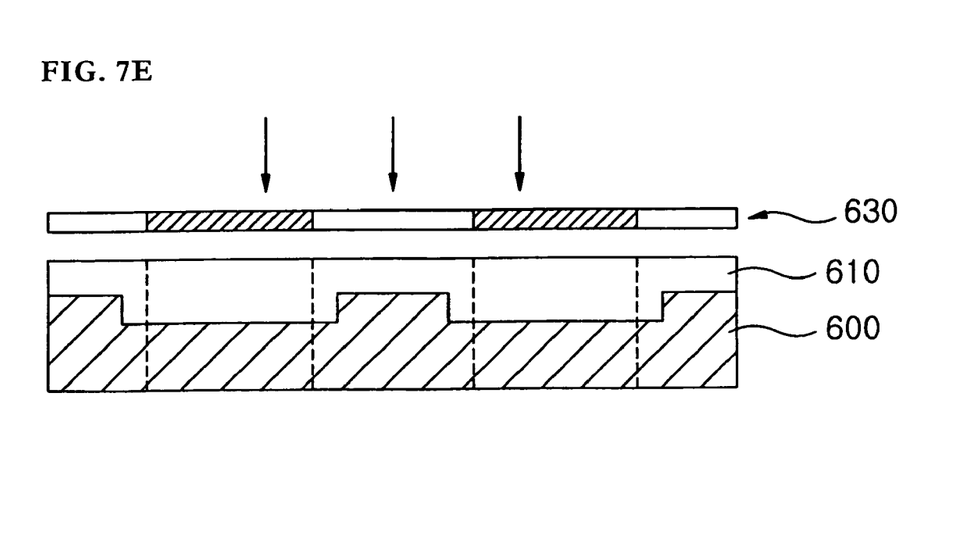

And, the photoresist 610 is applied onto the glass substrate 600 on which the first concave part 602 is formed, and a second mask 630 is disposed on top of the photoresist 610 on which a pattern is formed, as shown in FIG. 7E. The second mask 630 forms the pattern to a corresponding size to the device encapsulation area of the substrate 400.

Subsequently, a light is shot onto the top of the second mask 630. Accordingly, a part of the photoresist 610 exposed by the light is cured, and the other part not exposed by the light is not cured.

Figure 7F:
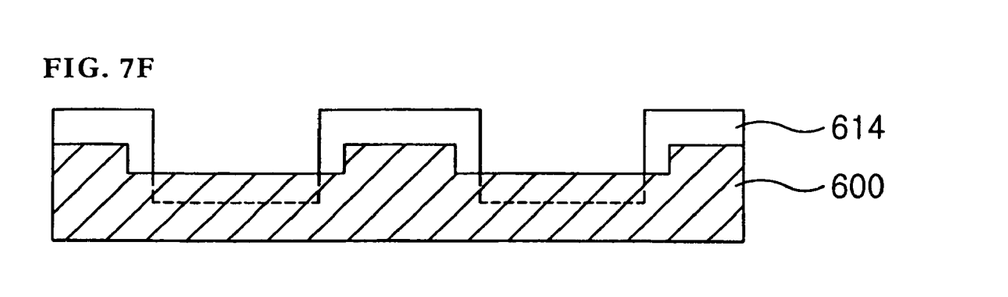

Then, a photoresist pattern 614 is formed by developing the exposed glass substrate 600 after removing the second mask 630, as shown in FIG. 7F.

Figure 7G:
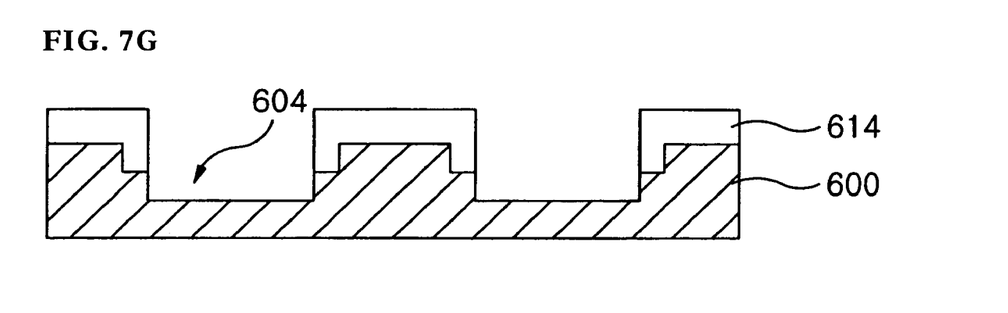

And, a second concave part 604 having a certain depth is formed by soaking the glass substrate 600 on which the pattern 614 is formed, in an etching solution for a certain period of time, as shown in FIG. 7G. The second concave part 604 corresponds to the device encapsulation area.

Figure 7H:
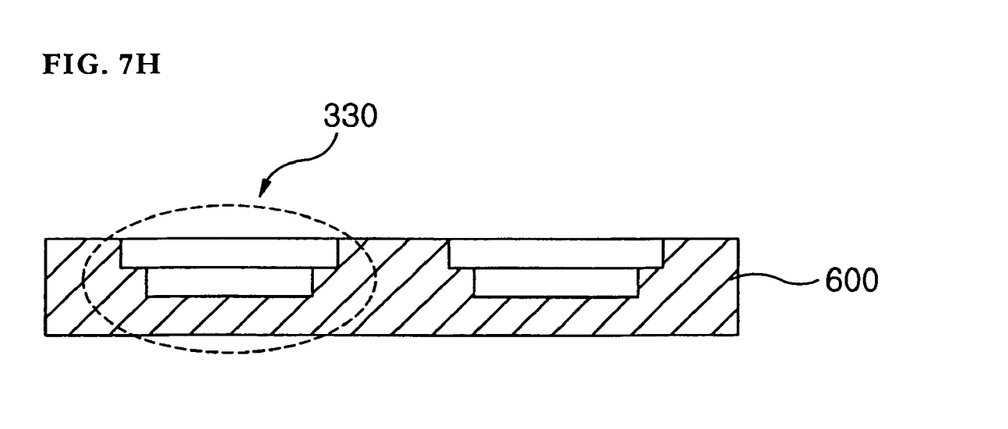

Then, the photoresist pattern 614 is peeled off by developing the glass substrate 600 on which the second concave part 604 is formed, as shown in FIG. 7H, whereby the encapsulation cap 330 as shown above is formed.

From the preferred embodiments for the present invention, it should be noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. An organic electroluminescent device, comprising:
   a substrate;
   an emitting area including a first electrode formed on a part of the substrate in a first direction, a second electrode formed in a second direction different from the first direction, and an organic layer formed on an area that the first electrode and the second electrode cross; and
   an encapsulation cap bonded to the substrate by a sealant to encapsulate the emitting area, and create a space for holding emitting area,
   wherein grooves are formed only at four edges of the sealing surface of the encapsulation cap onto which the sealant is applied so that the grooves are symmetrical each other, and wherein a depth of the groove is the same as that of the space.

2. The device of claim 1, wherein the sealing surface is protruded to form a space enough to hold the emitting area inside the encapsulation cap.

3. The device of claim 1, wherein the groove is of oblique line or circle form.

4. The device of claim 1, wherein the groove is wet etched groove.

5. A mother glass substrate for polyhedral encapsulation cap for manufacturing a plurality of encapsulation caps for encapsulating an organic electroluminescent device, comprising:
   frame form of protrusion parts defining a space for holding an emitting area of the organic electroluminescent device,
   wherein at least one first groove is formed on a top surface of a protrusion part, and a second groove is formed between adjacent protrusion parts, and wherein a depth of the first groove is the same as that of the space, and the depth of the first groove is the same as that of second groove.

6. The mother glass substrate of claim 5, wherein the top surface of the protrusion parts is a sealing surface onto which a sealant is applied for bonding the sealing surface to a substrate on which the emitting area is formed, and wherein the first groove formed on the protrusion parts can hold a sealant.

7. The mother glass substrate of claim 5, wherein the mother glass substrate is formed by removing a part of a glass substrate by wet etched method.

8. The mother glass substrate of claim 5, wherein the height of the protrusion parts is same as the depth of the first groove and the second groove.

9. The mother glass substrate of claim 5, wherein the groove is of oblique line or circle form.

* * * * *